United States Patent
Haubursin et al.

[19]

[11] Patent Number: 5,966,421
[45] Date of Patent: Oct. 12, 1999

[54] EMULATION OF AN M BIT COUNTER DRIVEN BY A DESIRED CLOCK FREQUENCY GIVEN A CENTRAL CLOCK FREQUENCY

[75] Inventors: Pierre Haubursin, Sunnyvale; Ching Yu, Santa Clara, both of Calif.

[73] Assignee: Advanced Micro Devices, Inc., Sunnyvale, Calif.

[21] Appl. No.: 08/989,435

[22] Filed: Dec. 12, 1997

[51] Int. Cl.⁶ .................................................. H03K 21/00
[52] U.S. Cl. ................................................ 377/47; 377/44
[58] Field of Search ........................................ 377/47, 44

[56] References Cited

U.S. PATENT DOCUMENTS 4,553,218 11/1985 Genrich ...................................... 377/52
5,214,682 5/1993 Clark ......................................... 377/47

Primary Examiner—Margaret R. Wambach
Attorney, Agent, or Firm—Monica H. Choi

[57] ABSTRACT

An m bit counter which counts to a desired clock frequency $F_D$ given a central clock frequency $F_C$ is emulated by a chain of two subcounters. The ratio r of the central clock frequency $F_C$ over the desired clock frequency $F_D$ is factored to $r=F_C/F_D=2^{n}* p$, where n is one of zero or an integer (i.e., 0, 1, 2, 3 . . . ) and where p is an integer. A 1 to p subcounter counts from 1 to p driven by the central clock frequency $F_C$. The output of the 1 to p counter is an intermediate clock frequency which includes a pulse every periodic count from 1 to p. The intermediate clock frequency drives a m+n bit subcounter with the n bits being appended as the least significant bits of the m+n bit subcounter. In this manner, the m most significant bits of the m+n bit subcounter count to the desired clock frequency $F_D$.

13 Claims, 3 Drawing Sheets

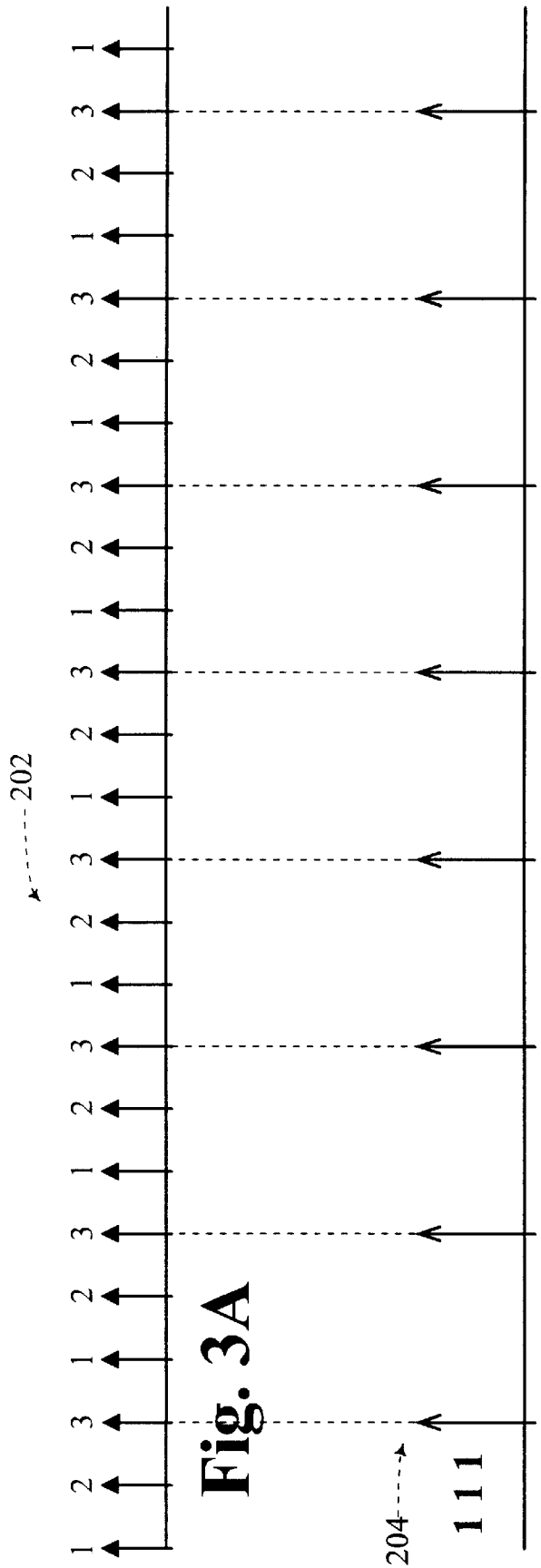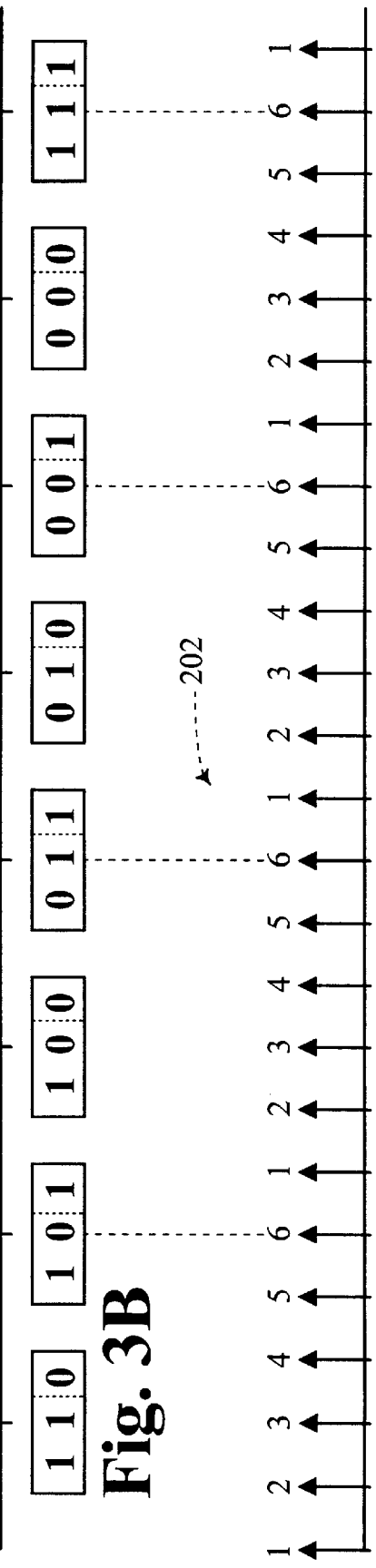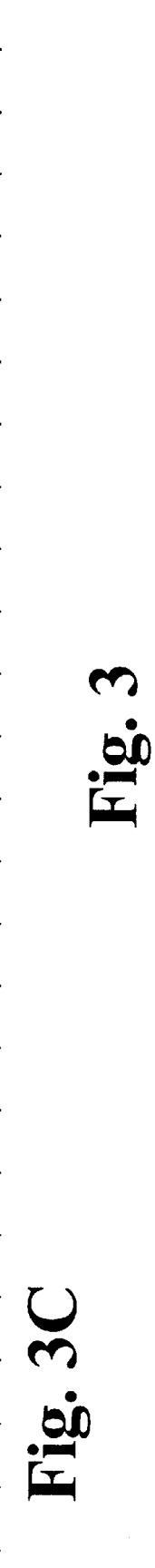
Fig. 3A  Fig. 3B  Fig. 3C
Fig. 3

EMULATION OF AN M BIT COUNTER DRIVEN BY A DESIRED CLOCK FREQUENCY GIVEN A CENTRAL CLOCK FREQUENCY

TECHNICAL FIELD

This invention relates to digital counters, and more particularly, to emulating an m bit counter driven by a desired clock frequency given a central clock frequency.

BACKGROUND OF THE INVENTION

Many digital systems use counters for various applications. For example, in an Ethernet computer network peripheral device, counters are used to keep track of various statistics such as how many bytes of a data packet have arrived at the computer network peripheral device. Moreover, counters within a single digital system may require counting to numerous different clock frequencies.

Each of these numerous clock frequencies may be generated by a respective clock frequency source. However, implementing a separate clock frequency source may be an expensive solution as the cost of each clock frequency source may be high. Moreover, for a digital system which is incorporated within a single integrated circuit, each clock frequency source may take up a large area on the integrated circuit. In addition, having multiple clock frequency sources may lead to more complexity in layout of the integrated circuit in routing the various clock frequencies throughout the integrated circuit.

Rather, a digital system may be more simple to implement as an integrated circuit if the numerous clock frequencies are locally synthesized from another central clock frequency already available on the digital system or if a counter requiring a count to a desired clock frequency is implemented using the given central clock frequency that is already available.

SUMMARY OF THE INVENTION

Accordingly, a primary object of the present invention is to emulate an m bit counter which counts to a desired clock frequency from a central clock frequency that is already available.

In a general aspect of the present invention an m bit counter counts to a desired clock frequency $F_D$ given a central clock frequency $F_C$. A ratio of the central clock frequency over the desired clock frequency is factored as $r=F_C/F_D=2^n* p$, with n being one of zero and an integer and with p being an integer. The m bit counter includes a first subcounter which counts from one to p driven by the central clock frequency $F_C$ to generate a pulse of an intermediate clock frequency for every periodic count from one to p. Furthermore, the m bit counter includes a second subcounter which counts m+n bits, including m bits of the m bit counter with an appended n bits as least significant bits. This second subcounter is driven by the intermediate clock frequency generated by the first subcounter. In this manner, the m most significant bits of the second subcounter counts as the m bit counter to the desired clock frequency $F_D$.

The present invention may be used to particular advantage for both an incrementing and a decrementing m bit counter. The ratio of the central clock frequency over the desired clock frequency $r=F_C/F_D=2^n* p$ may be factored with p being a prime number.

In other aspects of the present invention, at least one of the desired clock frequency $F_D$ and the central clock frequency $F_C$ is variable. In that case, the m bit counter further includes a data processor which determines n and p for $r=F_C/F_D=2^n* p$, wherein n is one of zero and an integer and wherein p is an integer, for each variation in at least one of the desired clock frequency $F_D$ and the central clock frequency $F_C$. The m bit counter further includes a counter controller for controlling the first subcounter to count from one to p to generate a pulse of an intermediate clock frequency for every periodic count from one to p, and for controlling the second subcounter to append n bits as least significant bits in the m+n bit count, for each variation in at least one of the desired clock frequency $F_D$ and the central clock frequency $F_C$.

These and other features and advantages of the present invention will be better understood by considering the following detailed description of the invention which is presented with the attached drawings.

BRIEF DESCRIPTION OF THE DRAWINGS

FIGS. 2A, 2B, and 2C, shows a time line of operation of the m bit counter of FIG. 1 when the m bit counter increments by one bit, according to a preferred embodiment of the present invention;

FIG. 3, including FIGS. 3A, 3B, and 3C, shows a time line of operation of the m bit counter of FIG. 1 when the m bit counter decrements by one bit, according to a preferred embodiment of the present invention.

The figures referred to herein are drawn for clarity of illustration and are not necessarily drawn to scale. Elements having the same reference numeral in FIGS. 1–4 refer to the same element.

DETAILED DESCRIPTION

The primary objective of the present invention is to implement an m bit counter which counts to a desired frequency $F_D$ from an available central clock frequency $F_C$. Typically, the central clock frequency $F_C$ has a higher frequency than the desired frequency $F_D$. The present invention is directed to the case where the ratio, r, of the central clock frequency $F_C$ over the desired clock frequency $F_D$, $r=F_C/F_D$, is an integer (i.e., 1, 2, 3. . . ).

When r is an integer, r may be factored to $r=F_C/F_D=2^n* p$, where n is one of zero or an integer (i.e., 0, 1, 2, 3. . . ) and where p is an integer. In one embodiment of the present invention, the ratio r may be further factored by 2 until p is an odd number that is no longer divisible by 2.

Figure 1:
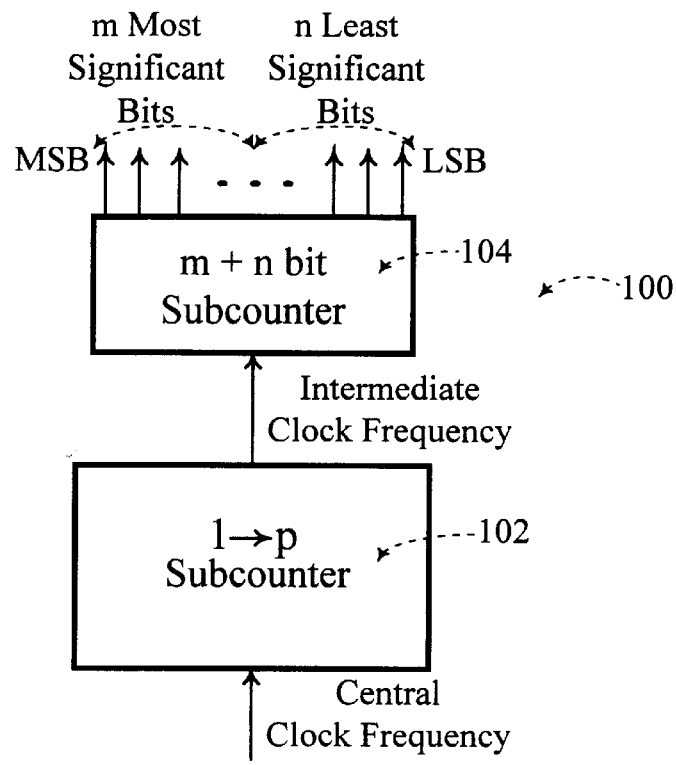
FIG. 1 shows components of an m bit counter which counts m bits to a desired clock frequency given a central clock frequency, according to one preferred embodiment of the present invention.

Referring to FIG. 1, once the ratio $r=F_C/F_D$ has been factored to $r=2^n* p$, an m bit counter 100 which counts to the desired frequency $F_D$ is implemented by two subcounters. A 1 to p subcounter 102 is coupled to a m+n bit subcounter 104. The operation of the m bit counter 100 according to a preferred embodiment of the present invention is now described with reference to FIGS. 1 and 2 and with an example m bit counter which counts to an example desired clock frequency $F_D$ given an example central clock frequency $F_C$.

For such an example, assume that the m bit counter is a 2 bit counter (i.e., m=2) which counts to a desired clock frequency $F_D$ of 1 MHZ (megahertz), and that the given central clock frequency $F_C$ is 6 MHZ (megahertz). The ratio, r, of the central clock frequency $F_C$ over the desired clock frequency $F_D$, $r=F_C/F_D=6$ MHZ/1 MHZ=6. The ratio r may be factored to $r=2^{n}*p=6=2*3$. Thus, in this example, n=1, and p=3.

Figure 2:
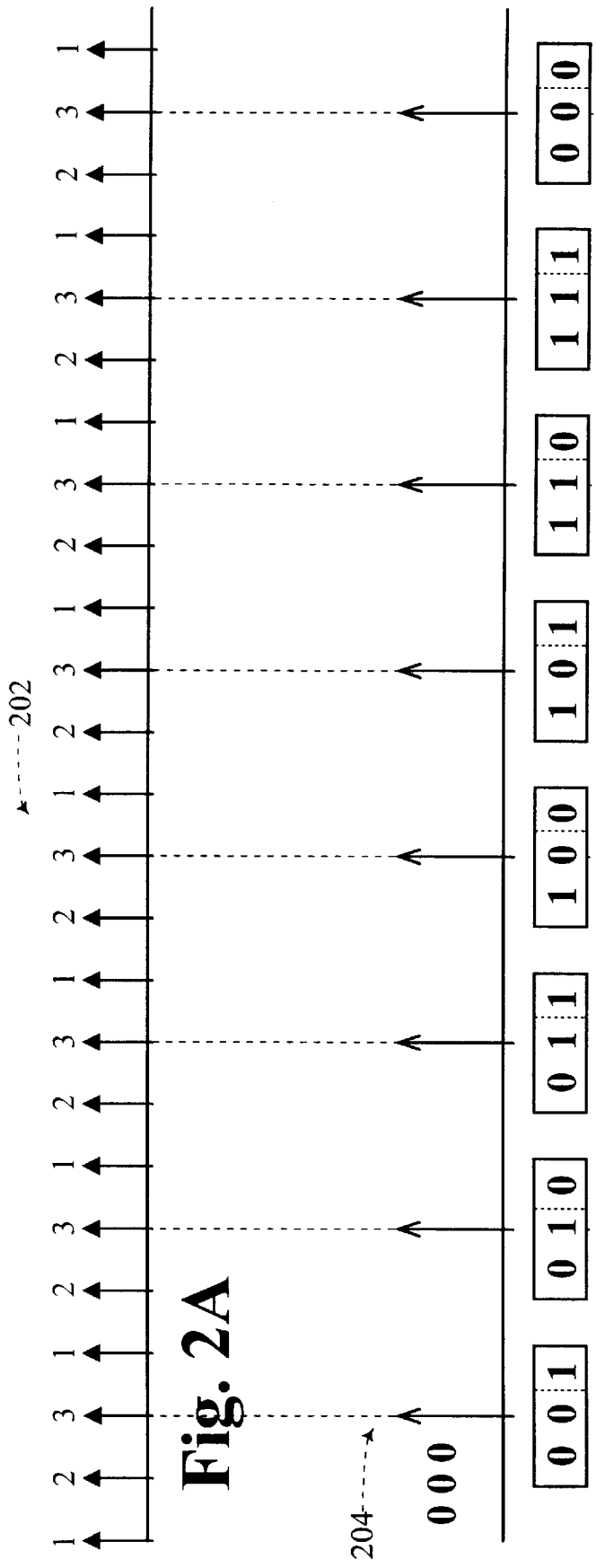
FIG. 2, including
Figure 2:
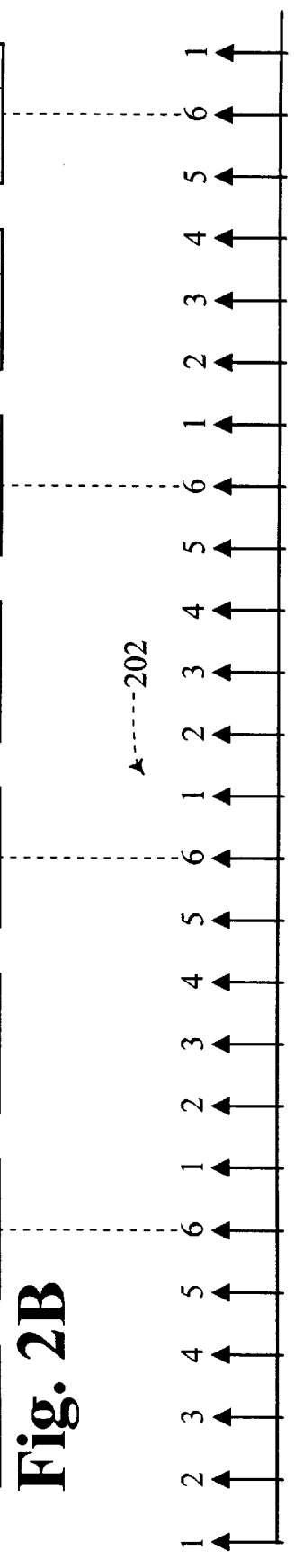

Referring to FIGS. 1 and 2, including FIGS. 2A, 2B, and 2C, FIG. 2A shows a train of pulses 202 which comprises the central clock frequency $F_C$. The 1 to p subcounter 102 of FIG. 1 counts from 1 to p driven by the central clock frequency $F_C$ train of pulses 202. For the example above, p=3, thus, the 1 to p subcounter 102 counts from 1 to 3 and increments by 1 in this count at every pulse in the central clock frequency $F_C$ train of pulses 202 as shown above every pulse in FIG. 2A. During this count of 1 to p, the 1 to p subcounter 102 outputs an intermediate clock frequency train of pulses 204 of FIG. 2B with a pulse at every count of a 3.

Referring to FIG. 1, this intermediate clock frequency drives the m+n bit subcounter 104. In the example above, m=2, and n=1. Thus, the m+n bit subcounter 104 is a 3 bit counter. Referring to FIG. 2B, the 3 bit subcounter 104 is driven by the intermediate clock frequency train of pulses 204. The count at the 3 bit subcounter 104 starts with bits 000 and increments by one bit at every pulse in the intermediate clock frequency train of pulses 204 as shown in FIG. 2B.

The desired 2 bit counter at the frequency of 1 MHZ from the central clock frequency of 6 MHZ of FIG. 2A is obtained by the m most significant bits of the m+n subcounter 104 (i.e. the 2 most significant bits of the 3 bit subcounter in the above example). Referring to FIG. 2B and FIG. 2C, note that the 2 most significant bits increment by one bit every 6 pulse of the 6 MHZ train of pulses of FIG. 2A. FIG. 2C is the central clock frequency $F_C$ train of pulses 202 of FIG. 2A with the pulses periodically numbered 1 to 6. Thus, if the central clock frequency $F_C$ train of pulses 202 of FIG. 2A is running at 6 MHZ, then every sixth pulse as shown in FIG. 2C is at 1 MHZ. Consequently, the 2 most significant bits of the m+n subcounter 104 of FIG. 2 increments by a bit at 1 MHz which is the desired clock frequency $F_D$.

In this manner, the desired 2 bit counter counting to the desired clock frequency $F_D$ is implemented given the central clock frequency $F_C$. Two subcounters, the 1 to p subcounter 102 and the m+n subcounter 104 together with the given central clock frequency $F_C$ emulate an m bit counter which counts to the desired clock frequency $F_D$. Thus, an additional clock signal generator which generates the desired clock frequency $F_D$ is not required, and fewer clock signal generators may in turn result in a simpler layout of the integrated circuit having the m bit counter 100.

The 1 to p subcounter 102 and the m+n bit subcounter 104 may be implemented as any counter circuitry that is known to one of ordinary skill in the art of digital circuit design. Alternatively, the 1 to p subcounter 102 and the m+n bit subcounter 104 may be data processors or programmable logic units which carry out the functions of the 1 to p subcounter 102 and the m+n bit counter 104.

FIGS. 3A, 3B, and 3C show the same clock frequency train of pulses as FIGS. 2A, 2B, and 2C respectively. However, in FIG. 3B, the m+n bit counter 104, (i.e. the 3 bit counter for the above example) starts at the state "111" and decrements by a bit for every pulse of the intermediate clock frequency train of pulses 204 of FIG. 3B. The 2 most significant bits decrement by a bit every 6th pulse of the central clock frequency as shown in FIGS. 3B and 3C. FIG. 3, including FIGS. 3A, 3B, and 3C, illustrate how an m bit counter which counts to the desired clock frequency $F_D$ given the central clock frequency $F_C$ may decrement by a bit (instead of incrementing by a bit as illustrated in FIGS. 2A, 2B, and 2C).

Figure 4:
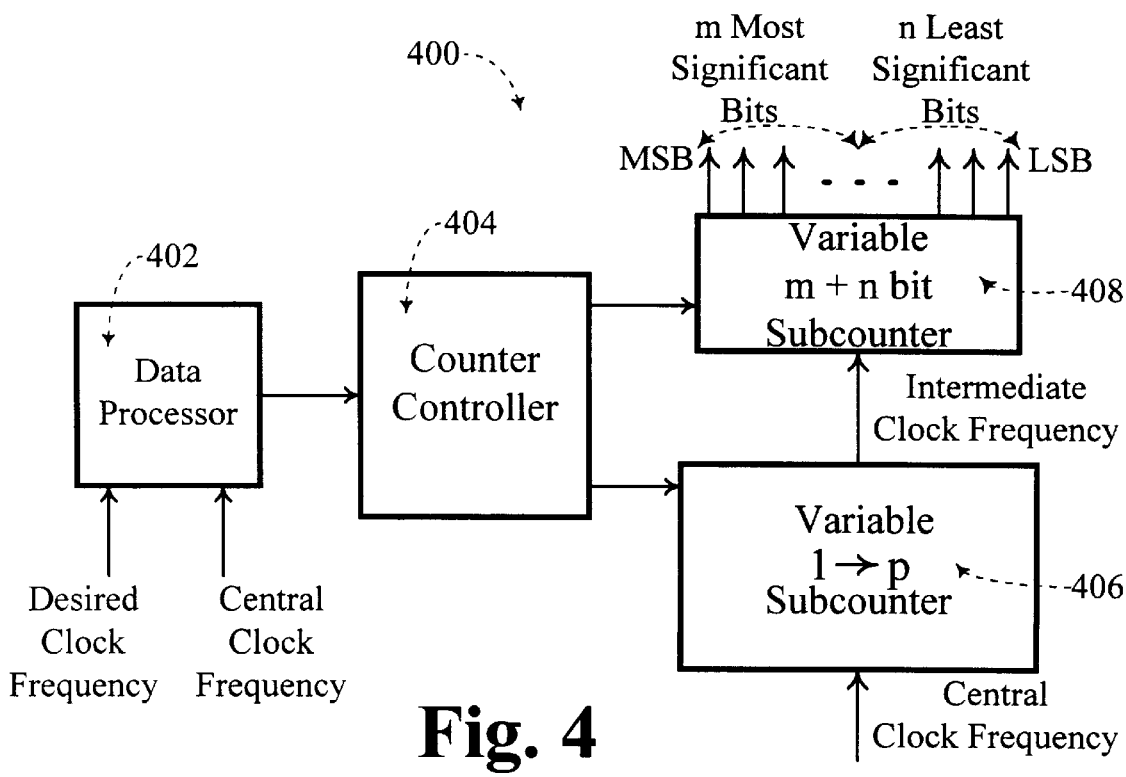
FIG. 4 shows the m bit counter of FIG. 1 further including components for handling variations in at least one of the desired clock frequency and the central clock frequency, according to another preferred embodiment of the present invention.

FIG. 4 shows another embodiment of an m bit counter 400 of the present invention which counts to a desired clock frequency $F_D$ given a central clock frequency $F_C$. For the m bit counter 400 of FIG. 4, the desired clock frequency $F_D$ and the central clock frequency $F_C$ may vary.

The m bit counter 400 of FIG. 4 includes a data processor 402 which accepts the variable desired clock frequency $F_D$ and the variable central clock frequency $F_C$ and determines the ratio $r=F_C/F_D$. The data processor also factors the ratio to $r=2^{n}*p$, where n is one of zero or an integer (i.e., 0, 1, 2, 3 . . . ) and where p is an integer.

A counter controller 404 coupled to the data processor 402 receive the n and p determined from the data processor 402, and uses the values of n and p to control a variable 1 to p subcounter 406 and a variable m+n subcounter 408. The 1 to p subcounter is variable in that p in $r=2^{n}*p$ may vary for each variation in at least one of the desired clock frequency $F_D$ and the central clock frequency $F_C$. The m+n subcounter 408 is variable in that n in $r=2^{n}*p$ may vary for each variation in at least one of the desired clock frequency $F_D$ and the central clock frequency $F_C$.

However, once p and n are determined for each desired clock frequency $F_D$ and central clock frequency $F_C$, the operation of the m bit counter 400 of FIG. 4 is similar to the m bit counter 100 of FIG. 1 as already described herein for counting m bits to the desired clock frequency $F_D$ given the central clock frequency $F_C$. In this manner, the m bit counter 400 counts to m bits at the desired clock frequency $F_D$ given the central clock frequency $F_C$ even for any variations in the desired clock frequency $F_D$ or the central clock frequency $F_C$.

The foregoing is by way of example only and is not intended to be limiting. For example, the advantageous features of the present invention may be used in conjunction with any implementation of counters as is known to one of ordinary skill in the art for the 1 to p subcounter and the m+n bit subcounter. Moreover the example of the 2 bit counter counting to a desired clock frequency $F_D=1$ MHZ given a central clock frequency $F_C=6$ MHZ is by way of example only. The present invention may be readily implemented for any m bit counter counting to any desired clock frequency $F_D$ given any central clock frequency $F_C$ as would be readily apparent to one of ordinary skill in the art of digital system design from the example described herein. Moreover, the 1 to p subcounter may be further implemented by division into more than one subcounters if p is factored to $p=x*y$ with a chain of a 1 to x subcounter having an output which drives a 1 to y subcounter as would be readily apparent to one of ordinary skill in the art of digital system design. The invention is limited only as defined in the following claims and equivalents thereof.

We claim:

1. An m bit counter that counts to a desired clock frequency $F_D$ from a central clock frequency $F_C$, a ratio of the central clock frequency over the desired clock frequency $r=F_C/F_D=2^{n}*p$, wherein n is one of zero and an integer and wherein p is an integer, the m bit counter comprising:

a first subcounter which counts from one to p driven by the central clock frequency to generate a pulse of an intermediate clock frequency for every periodic count from one to p; and a second subcounter which counts m+n bits, including m bits of the m bit counter with an appended n bits as least significant bits, driven by the intermediate clock frequency generated by the first subcounter, whereby m most significant bits of the second subcounter counts as the m bit counter to the desired clock frequency $F_D$.

2. The m bit counter of claim 1, wherein the second subcounter increments by a bit in counting m+n bits when the m bit counter is an incrementing counter.

3. The m bit counter of claim 1, wherein the second subcounter decrements by a bit in counting m+n bits when the m bit counter is a decrementing counter.

4. The m bit counter of claim 1, wherein at least one of the desired clock frequency $F_D$ and the central clock frequency $F_C$ is variable, and wherein n and p are determined for $r=F_C/F_D=2^n*p$, wherein n is one of zero and an integer and wherein p is an integer, for each variation in at least one of the desired clock frequency $F_D$ and the central clock frequency $F_C$, the m bit counter further comprising:

a counter controller for controlling the first subcounter to count from one to p to generate a pulse of an intermediate clock frequency for every periodic count from one to p, and for controlling the second subcounter to append n bits as least significant bits in the m+n bit count, for each variation in at least one of the desired clock frequency $F_D$ and the central clock frequency $F_C$.

5. The m bit counter of claim 4, wherein p is an odd number.

6. The m bit counter of claim 1, wherein p is an odd number.

7. An m bit counter that counts to a desired clock frequency $F_D$ from a central clock frequency $F_C$, a ratio of the central clock frequency over the desired clock frequency $r=F_C/F_D=2^n*p$, wherein n is one of zero and an integer and wherein p is an odd number integer, the m bit counter comprising:

a first subcounter which counts from one to p driven by the central clock frequency to generate a pulse of an intermediate clock frequency for every periodic count from one to p;

a second subcounter which counts m+n bits, including m bits of the m bit counter with an appended n bits as least significant bits, driven by the intermediate clock frequency generated by the first subcounter;

whereby m most significant bits of the second subcounter counts as the m bit counter to the desired clock frequency $F_D$;

wherein the second subcounter increments by a bit in counting m+n bits when the m bit counter is an incrementing counter, and wherein the second subcounter decrements by a bit in counting m+n bits when the m bit counter is a decrementing counter;

wherein at least one of the desired clock frequency $F_D$ and the central clock frequency $F_C$ is variable, and wherein the m bit counter further comprises:

a data processor which determines n and p for $r=F_C/F_D=2^n*p$, wherein n is one of zero and an integer and wherein p is an integer, for each variation in at least one of the desired clock frequency $F_D$ and the central clock frequency; and a counter controller for controlling the first subcounter to count from one to p to generate a pulse of an intermediate clock frequency for every periodic count from one to p, and for controlling the second subcounter to append n bits as least significant bits in the m+n bit count, for each variation in at least one of the desired clock frequency $F_D$ and the central clock frequency $F_C$.

8. An m bit counter that counts to a desired clock frequency $F_D$ from a central clock frequency $F_C$, a ratio of the central clock frequency over the desired clock frequency $r=F_C/F_D=2^n*p$, wherein n is one of zero and an integer and wherein p is an integer, the m bit counter comprising:

means for generating an intermediate clock frequency having a pulse for every periodic count from one to p driven by the central clock frequency $F_C$; and means for counting m+n bits driven by the intermediate clock frequency, wherein n bits are appended as least significant bits of the m+n bits, and whereby m most significant bits count as the m bit counter to the desired clock frequency $F_D$.

9. The m bit counter of claim 8, wherein at least one of the desired clock frequency $F_D$ and the central clock frequency $F_C$ is variable, and wherein the m bit counter further comprises:

means for determining n and p for $r=F_C/F_D=2^n*p$, wherein n is one of zero and an integer and wherein p is an integer, for each variation in at least one of the desired clock frequency $F_D$ and the central clock frequency $F_C$; and means for controlling the means for generating the intermediate clock frequency to generate a pulse for every periodic count from one to p, and for controlling the means for counting m+n bits to append n bits as least significant bits in the m+n bit count, for each variation in at least one of the desired clock frequency $F_D$ and the central clock frequency $F_C$.

10. A method for counting m bits to a desired clock frequency $F_D$ from a central clock frequency $F_C$, a ratio of the central clock frequency over the desired clock frequency $r=F_C/F_D=2^n*p$, wherein n is one of zero and an integer and wherein p is an integer, the method including the steps of:

generating a pulse of an intermediate clock frequency for every periodic count from one to p driven by the central clock frequency $F_C$; and appending n bits to m bits to generate a m+n bit count driven by the intermediate clock frequency, whereby m most significant bits, of the m+n bits, count to the desired frequency $F_D$.

11. The method of claim 10, wherein the m+n bit count increments by a bit in counting m+n bits for an incrementing m bit count.

12. The method of claim 10, wherein the m+n bit count decrements by a bit in counting m+n bits for a decrementing m bit count.

13. The method of claim 10, wherein at least one of the desired clock frequency $F_D$ and the central clock frequency $F_C$ is variable, and wherein the method further includes the steps of:

determining n and p for $r=F_C/F_D=2^n*p$, wherein n is one of zero and an integer and wherein p is an integer, for each variation in at least one of the desired clock frequency $F_D$ and the central clock frequency $F_C$; and generating a pulse of the intermediate clock frequency for every periodic count from one to p, and appending n bits as least significant bits in the m+n bit count, for each variation in at least one of the desired clock frequency $F_D$ and the central clock frequency $F_C$.

* * * * *